United States Patent
Kawasaki et al.

(10) Patent No.: US 10,173,287 B2
(45) Date of Patent: Jan. 8, 2019

(54) SOLDER MATERIAL, SOLDER JOINT, AND METHOD OF MANUFACTURING THE SOLDER MATERIAL

(71) Applicant: Senju Metal Industry Co., Ltd., Tokyo (JP)

(72) Inventors: Hiroyoshi Kawasaki, Tochigi (JP); Takahiro Roppongi, Tochigi (JP); Daisuke Soma, Tochigi (JP); Isamu Sato, Saitama (JP); Yuji Kawamata, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 15/327,510

(22) PCT Filed: Aug. 29, 2014

(86) PCT No.: PCT/JP2014/072803
§ 371 (c)(1),
(2) Date: Jan. 19, 2017

(87) PCT Pub. No.: WO2016/031067
PCT Pub. Date: Mar. 3, 2016

(65) Prior Publication Data
US 2017/0252871 A1    Sep. 7, 2017

(51) Int. Cl.
*B23K 1/00* (2006.01)
*B23K 35/02* (2006.01)
(Continued)

(52) U.S. Cl.
CPC .......... *B23K 35/0244* (2013.01); *B22F 1/02* (2013.01); *B23K 35/26* (2013.01); *B23K 35/262* (2013.01);
(Continued)

(58) Field of Classification Search
CPC .............. B23K 35/0244; B23K 35/365; B23K 35/262; H01L 24/11; H01L 24/13;
(Continued)

(56) References Cited

U.S. PATENT DOCUMENTS 5,427,303 A * 6/1995 Nowotarski ......... B23K 1/0016
228/180.22
9,279,176 B2   3/2016 Nishi et al.
(Continued)

FOREIGN PATENT DOCUMENTS

JP   4084657 B2   4/2008
JP   2009248156 A   10/2009
(Continued)

OTHER PUBLICATIONS

Machine translation of JP 2009248156A (no date available).*
Machine translation of JP 2013211508 a (no date available).*

*Primary Examiner* — Kiley S Stoner
(74) *Attorney, Agent, or Firm* — The Webb Law Firm

(57) ABSTRACT

Provided is a solder material which enables a growth of an oxide film to be inhibited. A solder ball which is a solder material is composed of a solder layer and a covering layer covering the solder layer. The solder layer is spherical and is composed of a metal material containing an alloy including Sn content of 40% and more. Otherwise the solder layer is composed of a metal material including Sn content of 100%. In the covering layer, a SnO film is formed outside the solder layer, and a $SnO_2$ film is formed outside the SnO film. A thickness of the covering layer is preferably more than 0 nm and equal to or less than 4.5 nm. Additionally, a yellow chromaticity of the solder ball is preferably equal to or less than 5.7.

6 Claims, 2 Drawing Sheets

(51) Int. Cl.

| | | |
|---|---|---|
| *B22F 1/02* | (2006.01) | |
| *B23K 35/26* | (2006.01) | |
| *B23K 35/365* | (2006.01) | |
| *C22C 13/00* | (2006.01) | |
| *C23C 8/10* | (2006.01) | |
| *H01L 23/00* | (2006.01) | |
| *C23C 8/36* | (2006.01) | |
| *C23C 28/04* | (2006.01) | |

(52) U.S. Cl.
CPC .......... *B23K 35/365* (2013.01); *C22C 13/00* (2013.01); *C23C 8/10* (2013.01); *C23C 8/36* (2013.01); *C23C 28/04* (2013.01); *H01L 24/11* (2013.01); *H01L 24/13* (2013.01); *B22F 2999/00* (2013.01); *H01L 2224/1182* (2013.01); *H01L 2224/11318* (2013.01); *H01L 2224/1312* (2013.01); *H01L 2224/1316* (2013.01); *H01L 2224/13109* (2013.01); *H01L 2224/13111* (2013.01); *H01L 2224/13113* (2013.01); *H01L 2224/13139* (2013.01); *H01L 2224/13147* (2013.01); *H01L 2224/13155* (2013.01); *H01L 2224/13157* (2013.01); *H01L 2224/13561* (2013.01); *H01L 2224/13687* (2013.01); *H01L 2924/014* (2013.01); *H01L 2924/0105* (2013.01); *H01L 2924/0544* (2013.01)

(58) Field of Classification Search
CPC ... H01L 2224/13147; H01L 2224/1316; H01L 2224/13157; H01L 2224/13155; H01L 2224/1182; H01L 2224/13139; H01L 2224/13111; H01L 2924/014; H01L 2924/0544; H01L 2224/13687; H01L 2224/13561; H01L 2224/13113; H01L 2224/13109; H01L 2224/1312; H01L 2224/11318; C22C 13/00; C23C 8/10
USPC .................. 228/248.1–248.5, 180.22, 56.3; 148/23–24
See application file for complete search history.

(56) References Cited

U.S. PATENT DOCUMENTS

| | | | | |
|---|---|---|---|---|
| 9,773,744 | B2* | 9/2017 | Willeke | .................. H01L 24/11 |
| 2004/0000580 | A1* | 1/2004 | Lee | ........................ B23K 1/008 |
| | | | | 228/220 |
| 2004/0121576 | A1* | 6/2004 | Su | ........................... H01L 24/11 |
| | | | | 438/613 |
| 2007/0215985 | A1* | 9/2007 | Chen | ....................... H01L 23/42 |
| | | | | 257/622 |
| 2009/0152719 | A1* | 6/2009 | Lee | ..................... H01L 21/4846 |
| | | | | 257/738 |
| 2013/0017681 | A1* | 1/2013 | Willeke | ............... B23K 1/0016 |
| | | | | 438/614 |
| 2013/0175688 | A1* | 7/2013 | Lee | ........................ H01L 24/13 |
| | | | | 257/738 |

FOREIGN PATENT DOCUMENTS

| | | | |
|---|---|---|---|
| JP | 2009275240 | A | 11/2009 |
| JP | 2013211508 | A * | 10/2013 |
| WO | 2010061795 | A1 | 6/2010 |

* cited by examiner

SOLDER MATERIAL, SOLDER JOINT, AND METHOD OF MANUFACTURING THE SOLDER MATERIAL

CROSS-REFERENCE TO RELATED APPLICATION

This application is the United States national phase of International Application No. PCT/JP2014/072803 filed Aug. 29, 2014, the disclosure of which is hereby incorporated in its entirety by reference.

TECHNICAL FIELD

The present invention relates to a solder material, main component of which is Sn, a solder joint and a method of manufacturing the solder material.

BACKGROUND

Recently, along development of compact information equipment, electronic components to be mounted thereon have been downsized rapidly. A ball grid alley (hereinafter referred to as "BGA") having electrodes at its rear surface is applied to such electronic components in order to cope with a narrowed connection terminal and a reduced mounting area because of the downsizing requirement.

As the electronic components to which the BGA is applied, for example, a semiconductor package is exemplified. In the semiconductor package, semiconductor chips having electrodes are sealed with resin. Solder bump is formed on each of the electrodes of the semiconductor chips. This solder bump is formed by joining a solder ball to an electrode of the semiconductor chip. The semiconductor package to which BGA is applied is placed on a printed circuit board so that each solder bump can contact an electrically conductive land of the printed circuit board, and mounted on the printed circuit board by joining the solder bump melted by heating and the land.

Now, it is required that forming a metal oxide film on a surface of a solder ball should be inhibited, in order to join the solder ball to the electrode. In addition, in a case where a solder ball is mixed with flux and then is used as solder paste, it is required that a rise in viscosity should be inhibited during storage.

Here, there is a proportional relationship between a film thickness of the oxide film formed on the surface of the solder ball and the yellow chromaticity. Accordingly, a technology has been proposed, wherein an oxide film is destroyed by the heating, with the use of a solder ball whose oxide film is equal to or less than a predetermined value, that is the yellow chromaticity is equal to or less than a predetermined value, to be able to perform joining (See Patent Document 1, for example.) This Patent Document 1 discloses that a solder ball, yellowness on the surface of which is equal to or less than 10 after being manufactured, are firstly selected, and then the storage status is strictly managed, and therefore the yellowness on the surface of the solder ball is prevented. And namely, the growth of a SnO oxide film on the surface of the solder ball is inhibited, as well as a SnO oxide film and a $SnO_2$ oxide film are formed on the surface of the solder bump which is formed by using the solder ball.

Additionally, a technology has been proposed, wherein a rise in viscosity can be inhibited by forming an oxide film having a predetermined value on a surface of a solder ball (See Patent Document 2, for example). This Patent Document 2 discloses that an oxide film composed of tin oxide, main component of which is either SnO or $SnO_2$ is formed on each of the surfaces of solder particles, and a rise in viscosity over time is inhibited after solder paste is manufactured by mixing and stirring them with flux.

Patent Document 1: Japanese Patent Application Publication No. 2009-248156
Patent Document 2: Japanese Patent No. 4084657

SUMMARY OF THE INVENTION

Problems to be Solved by the Invention

For a solder ball containing Sn as a main component, a SnO film is formed by Sn reaction with $O_2$ in the air. In a case of an increase of this film thickness, when an oxide film which is difficult to be removed by the flux at the time of soldering remains on the surface of the solder ball, the wettability gets worse. Additionally, when the film thickness of the oxide film increases, the yellow chromaticity increases. As an appearance inspection for solder balls, there is an occasion when the yellow chromaticity is used, and when an increase of the film thickness cannot be inhibited, there is a high possibility of a judgment that the solder ball is not suitable for use.

In Patent Document 1, a growth of the SnO oxide film on the surface of the solder ball has been inhibited by managing the storage status strictly. Also, in Patent Document 1, it is noted that a $SnO_2$ oxide film which is crystalline is easy to fracture by an internal deformation occurred due to the melting of a solder ball, and bondability between solder and an electrode terminal is improved. However, there is no disclosure about inhibiting the growth of the oxide film with a composition of the oxide film, except for the management of the storage status. Moreover, as for Patent Document 2, there is no disclosure about inhibiting the growth of a SnO oxide film.

Accordingly, the present invention has an object to provide a solder material having a good storage ability and wettability, a solder joint, and a method of manufacturing the solder material, by enabling a growth of an oxide film to be inhibited.

Means for Solving the Problems

The inventors of the present invention have found that a growth of oxide film can be inhibited by covering a solder layer, main component of which is Sn with a covering layer having SnO and $SnO_2$. In addition, the covering layer having SnO and $SnO_2$ means that an oxide film layer composed of tin oxide, main component of which is SnO, and an oxide film layer composed of tin oxide, main component of which is $SnO_2$, respectively. That is the same in the following descriptions.

Accordingly, an invention recited herein relates to a solder material containing: a solder layer composed of either a metal material containing an alloy including Sn content of 40% and more, or a metal material including Sn content of 100%; and a covering layer covering the surface of the solder layer, the solder material being a sphere having a diameter of 1 to 1000 μm, wherein the covering layer includes a SnO film which is formed outside the solder layer and a $SnO_2$ film which is formed outside the SnO film, and a thickness of the covering layer is more than 0 nm and equal to or less than 4.5 nm.

An invention recited herein relates to the solder material according to the above clause wherein a yellow chromaticity is equal to or less than 5.7.

An invention recited herein relates to a solder material containing: a solder layer composed of either a metal material containing an alloy including Sn content of 40% and more, or a metal material including Sn content of 100%; and a covering layer covering the surface of the solder layer, the solder material being a sphere having a diameter of 1 to 1000 µm, wherein the covering layer includes a SnO film which is formed outside the solder layer and a $SnO_2$ film which is formed outside the SnO film, and a yellow chromaticity is equal to or less than 5.7.

An invention recited herein relates to the solder material according to any one of the above clauses, wherein the solder layer comprises 0% or more and less than 4% of Ag, 0% or more and less than 1% of Cu, 0 ppm or more and less than 5 ppm of P, and 0 ppm or more and less than 20 ppm of Ge.

An invention recited herein relates to the solder material according to any one of the above clauses wherein in order to make a contained amount of Sn equal to or more than 40%, (i) the solder layer contains a total amount of less than 1% of at least one element selected from a group of Ni, Co, Fe, and Sb, or less than 1% of the respective elements and a total amount of less than 40% of at least one element selected from a group of In and Bi, or less than 40% of either one of In and Bi and less than 20% of the other, or (ii) the solder layer contains a total amount of less than 1% of at least one element selected from a group of Ni, Co, Fe, and Sb, or less than 1% of the respective elements, or a total amount of less than 40% of at least one element selected from a group of In and Bi, or less than 40% of either one of In and Bi and less than 20% of the other.

An invention recited herein relates to the solder material according to any one of the above clauses, wherein an alpha dose to be radiated is equal to or less than 0.0200 $cph/cm^2$.

An invention recited herein relates to a solder joint obtained by using the solder material according to any one of the above clauses.

An invention recited herein relates to a method of manufacturing a solder material which is a sphere having a diameter of 1 to 1000 µm, wherein the method comprises a solder-layer-forming step of forming a solder layer, wherein a solder layer composed of either a metal material containing an alloy including Sn content of 40% and more, or a metal material including Sn content of 100% is formed, and an oxide-film-forming step of forming a covering layer on a surface of the solder layer, wherein a SnO film is formed outside the solder layer and a $SnO_2$ film is formed outside the SnO film, and a thickness of the covering layer is more than 0 nm and equal to or less than 4.5 nm.

An invention recited herein relates to the method of manufacturing the solder material according to the above clause, wherein in the oxide-film-forming step, a yellow chromaticity of a surface of the covering layer is equal to or less than 5.7.

An invention recited herein relates to the method of manufacturing the solder material according to the above clauses, wherein in the oxide-film-forming step, $O_2$—Ar plasma is discharged on the surface of the solder layer.

Effects of the Invention

According to the present invention, when a $SnO_2$ film is formed outside a SnO film in a covering layer which covers the solder layer, the chemical reaction of Sn with $O_2$ in the air is inhibited, each growth of the SnO film and the $SnO_2$ film is inhibited, and the increase of film thickness can be inhibited. Moreover, by inhibiting the increase of film thickness, turning yellow is inhibited and therefore, the yellow chromaticity can be inhibited with its degree 5.7 or less. Thereby, a solder material having good storage ability and wettability, and a solder joint using the solder material can be provided.

EMBODIMENTS FOR CARRYING OUT THE INVENTION

A solder material, a solder joint and a method of manufacturing the solder material according to the prevent invention will be described in detail hereinafter.

<Configuration Example of Solder Material>

Figure 1:
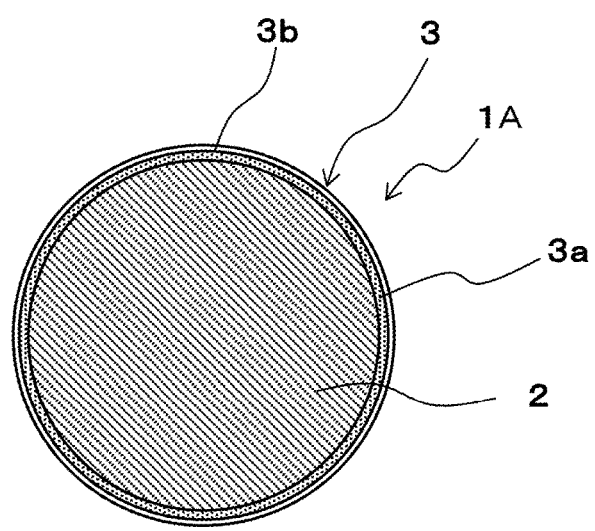
FIG. 1 is a cross-sectional view of a solder ball as an example of a solder material according to the present embodiment for showing a schematic configuration thereof.

FIG. 1 is a cross-sectional view of a solder ball as an example of a solder material according to the present embodiment for showing a schematic configuration thereof. In this specification, units (such as ppm, ppb, and %) relating to composition of the solder material represent ratios to mass of the solder material (mass ppm, mass ppb, and mass %), unless otherwise specified.

A solder ball 1A according to the present embodiment is composed of a solder layer 2 and a covering layer 3 covering the solder layer 2. The solder layer 2 is spherical and is composed of alloy material comprising 0% or more and less than 4% of Ag, 0% or more and less than 1% of Cu, and 40% or more of Sn. Although, in general, oxidation resistance is improved by adding a predetermined amount of P or Ge, the oxidation resistance can be improved without adding these in the present invention. However, the effect of the present invention is not lost, even if an amount of less than 5 ppm of P or an amount of less than 20 ppm of Ge is added. Therefore, P or Ge may not be added, but in a case of adding them, an addition amount of P is less than 5 ppm and an addition amount of Ge is less than 20 ppm. Accordingly, the addition amount of P is 0 ppm or more and less than 5 ppm, and the addition amount of Ge is 0 ppm or more and less than 20 ppm.

Moreover, in order to make a contained amount of Sn equal to or more than 40%, the solder layer contains a total amount of less than 1% of at least one element selected from a group of Ni, Co, Fe, and Sb, or less than 1% of the respective elements and a total amount of less than 40% of at least one element selected from a group of In and Bi, or less than 40% of either one of In and Bi and less than 20% of the other.

Otherwise, the solder layer 2 contains a total amount of less than 1% of at least one element selected from a group of Ni, Co, Fe, and Sb, or less than 1% of the respective elements, or a total amount of less than 40% of at least one element selected from a group of In and Bi, or less than 40% of either one of In and Bi and less than 20% of the other.

Furthermore, the solder layer 2 may contain a metal material including Sn content of 100%. In addition, an alpha dose radiated from the solder layer 2 is preferably equal to or less than 0.0200 cph/cm$^2$.

For the covering layer 3, a SnO film 3a is formed outside the solder layer 2, and a SnO$_2$ film 3b is formed outside the SnO film 3a. For a layer of SnO film formed on the surface of the solder layer 2, its film thickness becomes thicker as time passes, according to any exposure of the solder ball 1A to the air. Additionally, when the film thickness becomes thick, the surface of the solder ball 1A turns yellow.

Whereas, when the SnO$_2$ film 3b is formed outside the SnO film 3a, the chemical reaction of Sn with O$_2$ in the air is inhibited and the growth of the SnO film 3a and the SnO$_2$ film 3b is respectively inhibited, and consequently the increase of the film thickness is inhibited. Moreover, turning yellow is inhibited by inhibiting the increase of the film thickness, and therefore, a predetermined silver-white color which is close to a hue of a metal material composing the solder layer 2 is maintained.

A diameter of the solder ball 1A is preferably 1 to 1000 μm. Also, a thickness of the covering layer 3 is preferably more than 0 nm (which means that 0 nm is not included) and equal to or less than 4.5 nm. When the thickness of the covering layer 3 exceeds 4.5 nm, it is difficult to remove the covering layer 3 by flux at the time of soldering and therefore the wettability gets worse.

Moreover, the yellow chromaticity b* of the solder ball 1A is preferably equal to or less than 5.7. In managing the manufactured and stored solder ball 1A, there is an occasion when the yellow chromaticity is used. This is because a solder ball whose yellow chromaticity exceeds a predetermined value can be removed as unsuitable for use, from the fact that the yellow chromaticity is high and therefore the thickness of SnO film is thick.

The brightness and the yellow chromaticity were determined from the color value L*a*b*, by measuring spectral transmittance according to Japanese Industrial Standards (JIS-Z 8722) 'color measuring method—reflection and transparent object color' in D65 light source and 10 degree-sight, with the use of the CM-3500d2600d Spectrophotometer manufactured by Konica Minolta, INC.

Additionally, the color value L*a*b* is as stipulated in Japanese Industrial Standards (JIS-Z 8729) 'color displaying method—L*a*b* color space, and L*U*V* color space'.

Moreover, although a form of the solder material is spherical in the present executed examples, a cylindrical form, a square pole or any other form may be available. In addition, an alpha dose radiated from the solder ball 1A is also preferably equal to or less than 0.0200 cph/cm$^2$.

<Examples of Manufacturing Method of Solder Material>

Figure 2A:
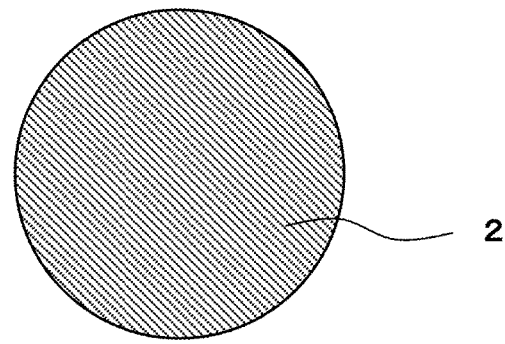
FIG. 2A is a cross-sectional view for schematically showing a method of manufacturing a solder ball as an example of the solder material according to the present embodiment.
Figure 2B:
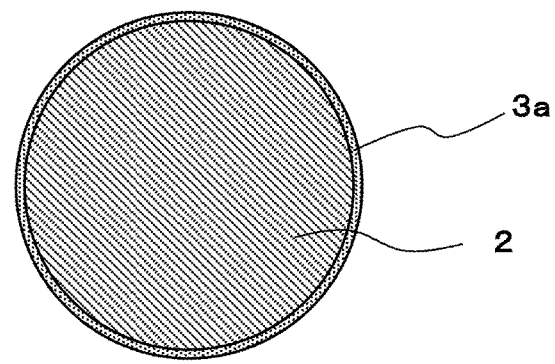
FIG. 2B is a cross-sectional view for schematically showing the method of manufacturing the solder ball as the example of the solder material according to the present embodiment.
Figure 2C:
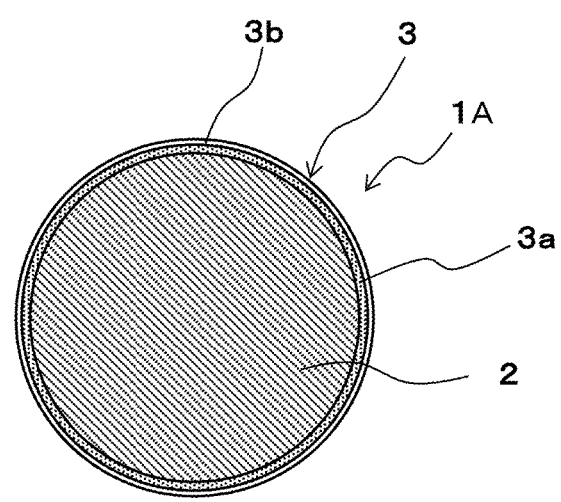
FIG. 2C is a cross-sectional view for schematically showing the method of manufacturing the solder ball as the example of the solder material according to the present embodiment.

FIGS. 2A, 2B and 2C are cross-sectional views for schematically showing a method of manufacturing the solder ball as an example of the solder material according to the present embodiment.

At a solder-layer-forming step, as shown in FIG. 2A, a spherical solder layer 2 is formed with either a metal material containing an alloy including Sn content of 40% and more, or a metal material including Sn content of 100%, as described above. At the solder-layer-forming step, in the present executed examples, a dropping method is used, wherein melted metal material is dropped and cured to sphere.

At an oxide-film-forming step, as shown in FIG. 2C, the SnO$_2$ film 3b is formed on the surface of the SnO film 3a generated by exposing the surface of the solder layer 2 to the air as shown in FIG. 2B. A publicly known method can be used as a method of forming an oxide film. A vapor deposition method, a sputtering method, a plasma discharge method and the like are enumerated, for example. In the present executed examples, the oxide-film-forming step is substantiated by using an atmospheric pressure plasma apparatus with the plasma discharge method. In the plasma discharge method, high density of O$_2$—Ar plasma is discharged during the process where the melted metal material is dropped and cured to sphere.

By manufacturing methods mentioned above, the solder ball 1A is manufactured, wherein the covering layer 3 is formed on the surface of the solder layer 2 having a predetermined diameter. The thickness of the covering layer 3a is more than 0 nm and equal to or less than 4.5 nm, and the SnO film 3a is formed outside the solder layer 2 and the SnO$_2$ film 3b is formed outside the SnO film 3a. Furthermore, the yellow chromaticity of the solder ball 1A is equal to or less than 5.66.

Executed Examples

Metal balls each corresponding to the solder layer 2 were manufactured with metal material containing 3% of Ag, 0.5% of Cu, and Sn as the balance by the dropping method. A solder ball in each of the executed examples was generated by forming a film corresponding to the covering layer 3 on each of the metal balls by the plasma discharge method. In the plasma discharge method, high density of O$_2$—Ar plasma was discharged during the process where the melted metal material is dropped and cured to sphere.

As comparison examples, solder balls in each of which a SnO layer was formed on the surface thereof by natural oxidation were generated.

Each of the solder balls in the executed example and the comparison example was heated at the temperature of 200 degrees C. and the result of the observation of an oxidation behavior thereof was shown at yellow chromaticity b* value in Table 1.

TABLE 1

|  | Elapsed Time (min) | | | | | |
| --- | --- | --- | --- | --- | --- | --- |
|  | 0 | 10 | 15 | 30 | 60 | 90 |
| Yellow Chromaticity b* in Executed example | 3.24 | 3.90 | 4.60 | 5.66 | 10.18 | 15.98 |
| Yellow Chromaticity b* in Comparison example | 3.63 | 10.21 | 13.15 | 18.79 | 24.32 | 25.35 |

As shown in Table 1, it has been proved that the yellow chromaticity b* value rises rapidly for the solder ball in the comparison example, whereas, according to the qualitative analysis by SERA (Sequential Electrochemical Reduction Analysis), for the solder ball in the executed example, the growth of the oxide film thickness is inhibited, because a SnO layer is formed outside the solder layer containing Sn as a main component, and a SnO$_2$ layer is formed outside the SnO layer.

Moreover, in order to separate the oxidation step from the heating test step in the comparison example, for reference, a one-minute heating was conducted with the temperature of 200 degrees C. and then another heating was conducted after cooling. However, the yellow chromaticity b* value rose rapidly similarly to the one before separating the steps.

Next, by FE-AES (Field Emission Auger Electron Spectroscopy), the quantitative analysis was performed on an oxide film thickness of each of the solder ball in the executed example 1 which had been heated at the temperature of 200 degrees C. for 15 minutes and the solder ball in the executed example 2 which had been heated at the temperature of 200 degrees C. for 30 minutes, as the solder ball in the executed example mentioned above. Also, the qualitative analysis thereof was performed by SERA, in order to confirm that a component of the formed oxide film is an oxide of Sn (SnO and $SnO_2$).

In addition, for the reason why FE-AES was used for the quantitative analysis, it is easier for analyses by FE-AES to show a definite value in order to discuss a specific oxide film thickness as quantitative analysis, whereas the analysis value by SERA varies widely, although it is possible to conduct the qualitative analysis by SERA. The thickness of the oxide film was measured by an apparatus and conditions described hereinafter. Moreover, a measured value of the oxide film thickness was obtained by $S_iO_2$ conversion.

Measuring apparatus: scanning FE-Auger Electron Spectroscopic Analyzer manufactured by ULVAC-PHI, Inc.

Measuring conditions: 10 kV of Beam Voltage; 10 nA of Sample Current (The measuring method of sputtered depth by using an Ar ion gun is based on ISO/TR 15969)

The measurement results of the oxide film thickness and the yellow chromaticity respectively are shown in Table 2.

TABLE 2

| | Elapsed Time (min) | Yellow Chromaticity b* | Film Thickness (nm) |
|---|---|---|---|
| EXECUTED EXAMPLE 1 | 15 | 4.60 | 2.6 |
| EXECUTED EXAMPLE 2 | 30 | 5.66 | 4.1 |

As shown in Table 2, it has been proved that the thickness of the oxide film is inhibited so to be 5 nm or less, and the thickness of the covering layer is preferably equal to or less than 4.5 nm. In addition, it has been proved that the yellow chromaticity is inhibited so to be 10 or less, and the yellow chromaticity is preferably equal to or less than 5.7 according to the result of Table 2.

Next, storage ability and wettability were verified in each of the solder balls in the executed examples and the comparison examples mentioned above, with the film thickness and yellow chromaticity thereof being changed and formed.

For each of the solder balls in the executed examples, the film thickness thereof was equal to or less than 4.5 nm. The film thickness was 2.6 nm for the solder ball in the executed example 1, the film thickness was 4.1 nm for the solder ball in the executed example 2, and the film thickness was 1.5 nm for the solder ball in the executed example 3, respectively.

Also, for each of the solder balls in the executed examples, the yellow chromaticity thereof was equal to or less than 5.7. The yellow chromaticity was 4.60 for the solder ball in the executed example 1, the yellow chromaticity was 5.66 for the solder ball in the executed example 2, and the yellow chromaticity was 3.90 for the solder ball in the executed example 3, respectively.

Meanwhile, for each of the solder balls in the comparison examples, the film thickness was equal to or more than 10 nm and the yellow chromaticity was equal to or more than 10. The yellow chromaticity was 10.21 for the solder ball in the comparison example 1, and the yellow chromaticity was 13.15 for the solder ball in the comparison example 2, respectively.

The verification result is shown in Table 3.

TABLE 3

| | Film Thickness (nm) | Yellow Chromaticity b* | Storage Ability | Wettability |
|---|---|---|---|---|
| EXECUTED EXAMPLE 1 | 2.6 | 4.60 | ○ | ○ |
| EXECUTED EXAMPLE 2 | 4.1 | 5.66 | ○ | ○ |
| EXECUTED EXAMPLE 3 | 1.5 | 3.90 | ○ | ○ |
| COMPARISON EXAMPLE 1 | >10 | 10.21 | X | X |
| COMPARISON EXAMPLE 2 | >10 | 13.15 | X | X |

As shown in Table 3, the predetermined conditions of both the storage ability and the wettability were met for each of the solder balls in the executed examples 1 through 3, whereas the predetermined conditions of both the storage ability and the wettability were not met for each of the solder balls in the comparison examples.

Accordingly, it has been proved that both of the storage ability and the wettability are improved for the solder ball whose covering layer thickness is more than 0 nm and equal to or less than 4.5 nm, and the yellow chromaticity b* is equal to or less than 5.7.

In addition, the solder material according to the present invention can be applied to a solder joint of electronic components, by being electrically joined to an electrode with solder paste.

DESCRIPTION OF CODES

1A Solder Ball
2 Solder Layer
3 Covering Layer
3a SnO Layer
3b $SnO_2$ Layer

The invention claimed is:
1. A solder material comprising:
a solder layer composed of either a metal material containing an alloy including Sn content of 40% and more, or a metal material including Sn content of 100%; and
a covering layer covering a surface of the solder layer,
wherein the covering layer includes a SnO film which is formed outside the solder layer and a $SnO_2$ film which is formed outside the SnO film,
a thickness of the covering layer is more than 0 nm and equal to or less than 4.5 nm,
a yellow chromaticity in L*a*b* color space is equal to or less than 5.7,
the solder material is a solder ball having a diameter of 1 to 1000 μm, and
the solder ball is a sphere.
2. The solder material according to claim 1, wherein the solder layer comprises 0% or more and less than 4% of Ag, 0% or more and less than 1% of Cu, 0 ppm or more and less than 5 ppm of P, and 0 ppm or more and less than 20 ppm of Ge.
3. The solder material according to claim 1, wherein in order to make a contained amount of Sn equal to or more than 40%,

(i) the solder layer contains a total amount of less than 1% of at least one element selected from the group consisting of Ni, Co, Fe, and Sb, or less than 1% of the respective elements and a total amount of less than 40% of at least one element selected from the group consisting of In and Bi, or less than 40% of either one of In and Bi and less than 20% of the other, or (ii) the solder layer contains a total amount of less than 1% of at least one element selected from the group consisting of Ni, Co, Fe, and Sb, or less than 1% of the respective elements, or a total amount of less than 40% of at least one element selected from the group consisting of In and Bi, or less than 40% of either one of In and Bi and less than 20% of the other.

4. The solder material according to claim 1, wherein an alpha dose to be radiated is equal to or less than 0.0200 cph/cm$^2$.

5. A method of manufacturing a solder material which is a spherical solder ball having a diameter of 1 to 1000 μm, wherein the method comprises:

a solder-layer-forming step of forming a solder layer, wherein a solder layer composed of either a metal material containing an alloy including Sn content of 40% and more, or a metal material including Sn content of 100% is formed, and an oxide-film-forming step of forming a covering layer on a surface of the solder layer, wherein in the covering layer, a SnO film is formed outside the solder layer and a SnO$_2$ film is formed outside the SnO film, a thickness of the covering layer is more than 0 nm and equal to or less than 4.5 nm, and yellow chromaticity in L*a*b* color space of a surface of the covering layer is equal to or less than 5.7.

6. The method of manufacturing the solder material according to claim 5, wherein in the oxide-film-forming step, O$_2$—Ar plasma is discharged on the surface of the solder layer.

* * * * *